United States Patent [19]

Tsubai et al.

[11] 4,160,670

[45] Jul. 10, 1979

[54] LITHOGRAPHIC PRINTING PLATE MATERIAL

[75] Inventors: Yasuo Tsubai; Shigeru Iguchi; Shigeyoshi Suzuki; Tamotsu Iwata, all of Nagaokakyo, Japan

[73] Assignee: Mitsubishi Paper Mills, Ltd., Tokyo, Japan

[21] Appl. No.: 822,191

[22] Filed: Aug. 5, 1977

[30] Foreign Application Priority Data

Aug. 10, 1976 [JP] Japan .................................. 51-95276

[51] Int. Cl.² .......................... G03C 5/54; G03C 1/48; B44D 1/09; C03C 17/06
[52] U.S. Cl. ................................ 96/119 R; 96/29 L; 96/76 R; 428/411; 428/500; 428/532
[58] Field of Search ................. 96/29 L, 76 R, 119 R; 428/539, 532, 500, 411

[56] References Cited

U.S. PATENT DOCUMENTS

| | | | |
|---|---|---|---|
| 3,728,114 | 4/1973 | Futaki et al. | 96/29 L |
| 3,751,255 | 8/1973 | Wilson et al. | 96/29 L |
| 3,870,479 | 3/1975 | Kubotera et al. | 96/29 L |
| 3,904,412 | 9/1975 | Serrien et al. | 96/29 L |
| 3,989,521 | 11/1976 | De Haas | 96/29 L |

OTHER PUBLICATIONS

Glafsides, Pierre, *Photographic Chemistry*, vol. 1, London, Fountain Press, 1958, pp. 274–278.

*Primary Examiner*—Richard L. Schilling
*Attorney, Agent, or Firm*—Cushman, Darby & Cushman

[57] ABSTRACT

Printing characteristics of a lithographic printing plate material using the silver complex diffusion transfer process are markedly improved by including in layer which contains nuclei for physical development or a layer adjacent thereto at least one member selected from the group consisting of polyfunctional synthetic polymers containing a functional group having an affinity to said nuclei and a functional group providing hydrophilic property and developing agents for silver halide.

22 Claims, No Drawings

LITHOGRAPHIC PRINTING PLATE MATERIAL

BACKGROUND OF THE INVENTION

This invention relates to a photographic element for the production of lithographic printing plates by the silver complex diffusion transfer process.

The lithographic printing plate consists of greasy ink receptive oleophilic image portions and ink repellent oleophobic non-image portions, the latter being generally water receptive hydrophilic areas.

Accordingly, the customary lithographic printing is carried out by feeding both water and colored ink to the printing plate surface to allow the image portions to receive preferentially the colored ink and the non-image portions preferentially water and then transferring the ink deposited on image portions onto a substrate such as paper for example. In order to obtain a print of good quality, therefore, it is necessary that oleophilic activity of the image portions and hydrophilic activity of the non-image portions are both strong enough so that when water and ink are applied the image portions may receive sufficient amount of ink while the non-image portions may completely repel the ink.

There has already been a printing plate in actual use, which is produced by providing a pattern in metallic silver on the plate surface by utilizing the silver diffusion transfer technique and thereafter making the pattern oleophilic or ink receptive. One of the examples is an image receiving sheet or photosensitive material proposed by the present applicants in U.S. Pat. No. 3,728,114, which comprises either physical development nuclei of heavy metals or sulfides thereof alone or a combination of said nuclei with a specific proportion of a polymeric compound as binder. As previously mentioned, an ideal lithographic printing plate is such that the image portion adequately receives an ink while the non-image portion perfectly repels the ink so that no toning on printing may occur. For this reason, various methods for rendering the non-image portion insensitive to oil have been studied according to the type of printing plate material and the printing process.

As known well in printing business circles, the toning in lithography does not originate from single source, but is generally associated with a combination of factors such as, for example, intrinsic properties of the printing plate; qualities of the printing ink, damping water and printing paper; condition of the printing press; and environmental factors such as temperature and humidity of the printing room during printing. Although it is important to carry out printing under printing conditions and environmental conditions maintained at optimal levels, yet there exists a demand from the practical standpoint for printing plates which can be used under conditions in the range as broad as possible.

In the case of the element fundamentally disclosed in the said U.S. Pat. No. 3,728,114, circumstances are similar to those mentioned above and the element has disadvantages in that tolerance limits are narrow for various commercial inks; printing characteristics vary with the lapse of time before or after the plate making; and toning is liable to occur in long run printing. Therefore, improvement of these disadvantages was wanted.

SUMMARY OF THE INVENTION

An object of this invention is to improve the above-said disadvantages and provide a novel printing element which has excellent ink-receptive characteristics and hardly causes toning.

The lithographic printing element of this invention which utilizes the silver complex diffusion transfer technique is characterized in that its image receiving layer containing nuclei for physical development comprising a heavy metal or a sulfide thereof and/or a layer adjacent to said layer contains a polymer having a functional group having affinity for said nuclei and a functional group capable of imparting to the polymer hydrophilic activity, and/or a developer for silver halides.

At the outset of the studies, which have led to this invention, the present inventors conducted varous tests on the toning caused by the lithographic printing plate which utilizes the silver complex diffusion transfer technique and arrived principally at the following conclusion:

It was ascertained that the first cause of toning is the reception of ink by the colloidal heavy metal or sulfide thereof providing nuclei for physical development and the second cause is the reception of ink by metallic silver particles in the non-image portion, which were formed by fogging on transfer development.

DESCRIPTION OF THE INVENTION AND PREFERRED EMBODIMENTS

This invention is an outcome of various attempts made by the present inventors to find effective countermeasures against both of the above-noted problems. Means for rendering substantially hydrophilic the nuclei for physical development comprising a heavy metal or a sulfide thereof were examined from various angles. Trials were made at the addition of a material high molecular compound such as, for example, gelatin, gum arabic, cellulose, albumin, sodium alginate, or various starches or a synthetic hydrophilic polymer such as polyvinyl alcohol, polyvinylpyrrolidone, or polyacrylamide in random ratios to the nuclei for physical development. The results obtained, however, were quite unsatisfactory in achieving the object of this invention, because, as described in U.S. Pat. No. 3,728,114 in connection with the fundamental principles the addition of such a polymer markedly interfered with ink receptivity of the metallic silver which had transferred and deposited; or the effect of such a polymer did not last for a sufficiently long period of time, even if the effect was more or less favorable; or the polymer induced or accelerated agglomeration of colloidal heavy metal or particles of a heavy metal sulfide. On the contrary, it was found that the above disadvantages may be overcome and the object of this invention may be achieved by including a polyfunctional polymer defined below and/or a developing agent for silver halides in a layer of nuclei for physical development and/or a layer ajdacent thereto.

The above-noted polyfunctional water soluble polymer is compatible with the nuclei for physical development and has printing advantages in that it does not or scarcely decrease the ink receptivity of the deposited silver and improves toning during long run printing without losing the effect.

The developing agent for silver halides is effective in preventing the toning, presumably because it suppresses transfer development fogging in the image receiving layer as the result of improvement in chemical developability of the silver halide emulsion layer.

The effective polymer for use in the present invention is that consisting essentially of 1 to 20 mole-% of the structural unit represented by the following formula (1) and 5 to 99 mole-% of the structural unit represented by the following formula (2):

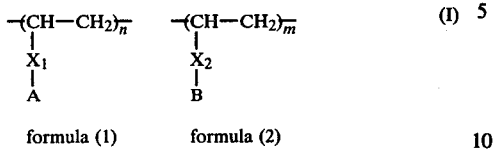

formula (1)    formula (2)

wherein A is a functional group having affinity for the colloidal heavy metal or a sulfide thereof and selected from the group consisting of (i) 5- or 6-membered heterocyclic groups having in their rings at least one atom selected from N, O, and S, heterocyclic groups formed by condensation of two or more of said 5- or 6-membered heterorings, and heterocyclic groups formed by condensation of said 5- or 6-membered heteroring with a benzene or naphthalene ring, (ii) thioether, thiol and thioxo groups, and (iii) amido and guanidino groups; B is a hydroxyl, carbonyl, sulfo or amido group which imparts hydrophilic activity to the polymer; $X_1$ and $X_2$, which may be absent, are groups connecting A and B, respectively, to one of the carbon atoms of the vinyl unit, such as, for example, $-O-$, $-CH_2-$, $-CH_2-CH_2-$ and $-CH=CH-$; n is 1 to 20 mole-% and m is 5 to 99 mole-%. The polymerization degree of the polymer is about 100 to about 3,000 based on recurring vinyl unit.

Examples of the individual heterocyclic groups represented by A, which have affinity for physical development nuclei, include imidazole, imidazoline, imidazolidine, benzyimidazole, imidazolone, imidazolidone, pyrazolidone, pyrazolene, pyrazolidine, pyrazoline, pyrazole, indazole, oxazolidone, oxazolone, oxazole, benzoxazole, thiazolidone, thiazolone, thiazolidine, thiazoline, thiazole, benzothiazole, pyrrolidone, pyrrolidine, pyrroline, pyrrole, indol, thiophene, benzothiophene, oxazine, thiazine, piperidine, pyridine, quinoline, pyrimidine, quinazoline, pyridazine, piperazine, pyrazine, quinoxazine, triazole, benztriazole, triazine, tetrazole, and purine.

Suitable hydrophilic groups represented by B are hydroxyl, carboxyl, amido, and sulfo groups. The content of a functional group having affinity for colloidal heavy metals or colloidal heavy metal sulfides, the content of a functional group providing hydrophilic property and the polymerization degree of the polymer are three important points in practicing the present invention.

The proper content of the functional group having affinity for the colloidal particles of a heavy metal or a sulfide thereof depends to some degree on the type of functional group itself, but is generally in the range of about 1 to 20 mole-%, preferably 2 to 10 mole-%. If the content of said group is too high, the deposited silver will become less ink-receptive or less compatible with colloidal particles on account of too high a hydrophilic activity. As for the functional group providing hydrophilic property, the object of this invention is achieved when it is contained in an amount of at least 5 mole-% and a desirable hydrophilicity is provided when its content is 50 to 99 mole-%, the remaining portions containing nonpolar substituents such as, for example, methyl and ethyl groups or none of the substituents. The average polymerization degree of the polymer used in this invention is about 100 to about 3,000, preferably about 300 to about 1,000. If it departs from the above range, the toning preventive ability will be diminished or some of the aforementioned disadvantages tend to arise.

An interesting fact found in connection with this invention is that a polymer with poor compatibility with the colloid particles used as nuclei for physical development, that is, a polymer which causes agglomeration of said colloid particles tends to inhibit markedly the ink receptivity of the printing plate.

For application of the polyfunctional synthetic polymers, there are two methods, one is to apply them together with nuclei for physical development and the other is to apply them before or after application of nuclei for physical development, but the most advantageous procedure is the former, i.e. coating the polymers together with the nuclei for physical development, in view of the stability of quality and the easiness of the operation and if necessary, the two methods may be combined.

Although depending to some degree upon the type, quantity and nature of the colloidal substance used as nuclei for physical development, the amount of polymer applied per square meter predominantly affects the printing characteristics. The application rate is usually 0.0001 to 0.1 g/m$^2$, preferably 0.001 to 0.05 g/m$^2$.

The polyfunctional polymers can be manufactured by, for example, common methods for vinyl polymerization. A solution of a mixture of two or three monomers is admixed with a polymerization initiator and heated, or a mixture of monomers is added dropwise to a solution containing a polymerization initiator, maintained at an elevated temperature. A large number of monomers susceptible to vinyl polymerization have been known (see, for example, "Synthetic polymers", published from Asakura Shoten Co.). It is also possible to introduce functional groups providing hydrophilic property such as carboxyl and hydroxyl groups into a polymer by hydrolysis or saponification of the polymerizate. An intended functional group can be introduced into a base polymer also by the substitution of active groups. The last method is particularly useful in introducing thiol or thioether group.

Further, the polyfunctional synthetic polymers which can be used in this invention are not limited to vinyl polymers. Other polymers such as, for example, a polymer having a main chain of polyethylene glycol and attached mercapto groups having affinity for the nuclei for physical development and a polymer having sulfo and mercapto groups attached to the main chain of cellulose are also useful.

These polymers may be used each alone or as mixtures of two or more members. Further, in another embodiment of the invention at least one of the polyfunctional synthetic polymers is used in combination with those hydrophilic polymers which do not contain functional groups having affinity for the nuclei for physical development, such as, for example, polyvinyl alcohol, polyvinylpyrrolidone, polyvinylacrylamide, carboxymethylcellulose, polyethylene glycol, polyvinyl methyl ether, and copolymer of polyvinyl methyl ether and maleic anhydride.

By the joint use of a polyfunctional synthetic polymer and a hydrophilic polymer, it is possible not only to achieve the intended object with smaller amounts of the polyfunctional synthetic polymer and without slightest sacrifice of ink receptivity, but also to obtain a printing plate which retains stable hydrophilic activity, keeping the plate from causing toning troubles, even when less water is supplied to the printing machine; the hydrophilicity thus imparted does not fall off in long-run printing.

The present inventors found that the method described in the foregoing is one of the means to solve the problem of printing toning caused by a lithographic printing plate having colloidal nuclei for physical development. Another technique developed by the present inventors pertained to suppression of the formation of metallic silver due to the transfer development fogging. The objects and advantages of the present invention will become apparent from the following description.

In the silver complex transfer process, the exposed silver halide photographic element is generally treated with an alkaline mono-bath developer fixer composition consisting essentially of a developer, an antioxidant for the developer, and a solvent for silver halides. According to the generally accepted concept concerning the silver complex diffusion transfer process, the silver halide particles rendered developable by exposure (contrary to the case of a silver halide photosensitive material of the direct positive type) are immediately reduced to metallic silver (chemical development) by a reducing agent (a developer component) in the said composition, while, on the other hand, the unexposed silver halide particles, which are difficult to reduce directly, become soluble by complexing with the silver halide solvent in the said composition and diffuse to be reduced on contact with the physical development nuclei which act as reducing catalyst (physical development). It is natural to consider that the silver halide solvent has some action also on the silver halide particles rendered developable by exposure. Accordingly, one of the important technical points of the silver complex diffusion transfer process seems to be the properly kept balance between the rate of chemical development and the rate of physical development including the rate of dissolution process. It has been made clear that generally the fogging due to transfer physical development tends to occur when the rate of chemical development is low or the rate of diffusion transfer physical development including the rate of dissolution of silver halides is high. Accordingly, two means are conceivable to eliminate the toning trouble due to the ink reception by transferred silver particles which have deposited as in the lithographic printing plate described above, one of the means being relative reduction of the rate of dissolution of silver halides and/or the rate of diffusion transfer physical development, and the other being acceleration of the rate of chemical development.

According to the results of the extensive experiments conducted by the present inventors, the former means, although effective to some degree in lessening the toning, has disadvantages of deterioration in the ink receptivity on account of reduced density of the deposit of transferred silver and deterioration in the image reproducibility. On the contrary, as described later, an unexpectable, surprising effect was exhibited by the latter means which utilizes a developing agent for silver halides to improve chemical developability of the silver halide emulsion as herein described. Such an effect is obtained preferably by applying a coating solution containing a developing agent over the silver halide emulsion coating layer which has been dried or subjected to heat hardening treatment.

It has been known to incorporate a part or whole of the developing agent in a common photosensitive silver halide emulsion layer. However, the best result pursued by the present inventors was obtained when the coating solution containing a developing agent was applied over the silver halide emulsion layer. Substantially no effect or only an insignificant effect was exhibited when the developing agent was included in the silver halide emulsion or in an undercoat below the emulsion layer.

The developing agents suitable for use in this invention are those of the hydroxybenzene type such as hydroquinone, catechol, and pyrogallol and derivatives thereof such as methylhydroquinone, dimethylhydroquinone, chlorohydroquinone, 4-methylcatechol, 4-ethylcatechol, 4-tert-butylcatechol, gallic acid, methyl gallate, and ethyl gallate; p-aminophenol and derivatives thereof such as, for example, N-methyl-p-aminophenol, and 2,4-diaminophenol sulfate; 1-phenyl-3-pyrazolidone and 1-phenyl-4-methyl-3-pyrazolidone. These developing agents are applied over the silver halide emulsion layer as an aqueous solution or as a solution in a water-miscible organic solvent such as methanol, ethanol, propanol, acetone and ethylene glycol. The solution containing a developing agent is applied preferably together with a solution containing colloidal heavy metals or colloidal heavy metal sulfides. The silver halide emulsion layer or an undercoat thereof may contain a developing agent for other purposes including activated development than the purpose of this invention.

The developing agent may be applied together with nuclei for physical development or may be applied before or after application of the physical development nuclei and the former is preferred. Alternatively, the developing agent can be applied alone onto the emulsion layer after exposure but prior to transfer development.

The sufficient amount to be applied of the developing agent according to this invention, for example, is 0.02 to 0.3 g/m$^2$ for hydroquinone and 0.002 to 0.02 g/m$^2$ for 1-phenyl-3-pyrazolidone. The photosensitive element obtained by use of a developing agent according to this invention is improved in printing toning and, in addition, has advantages of high contrast in photographic image as well as in printing characteristics, desirable sharpness of the image, excellent resolving power, and little variation in properties with the lapse of time.

A maximal improvement according to this invention is achieved by the joint use of the aforementioned polyfunctional synthetic polymer and a developing agent. In this case, the polymer and the developing agent may be contained together in the layer of nuclei for physical development or the layer adjacent thereto or may be contained separately in the layer of nuclei for physical development or the layer adjacent thereto. After having been subjected to the silver complex diffusion transfer development, the element thus obtained may be used in printing as such or after further treatment with a composition for improving ink receptivity, which contains an organic compound having —SH or >C=S group, as disclosed, for example, in Japanese Patent Publication No. 29,723/73.

This invention is characterized by the specifically composed image receiving layer in a lithographic printing plate utilizing silver complex diffusion transfer process, and, hence, no restriction is placed on other features of the printing element, such as, for example, type of the support, composition of the silver halide emulsion layer, procedure of silver complex diffusion transfer treatment, etc.

For instance, as the support, may be used conventional supports for photosensitive materials, such as films of synthetic resins such as polyester, polycarbonate, polypropylene, polystyrene, and the like; waterproofed paper such as polyethylene-coated paper; and composite supports such as a support with aluminum backing.

The photosensitive silver halide emulsion for use in the present element can be any of the photographic emulsions such as those of chloride, chlorobromide, bromide, chloroiodide, bromoiodide, and chlorobromiodide of silver. In order to be of required photosensitivity characteristics, the present photosensitive material may be chemically sensitized in the ways known to photographic art. Sulfur sensitization and gold sensitization can be used to produce high-contrast photographic characteristics. In order to effect spectral sensitization, sensitizing dyes such as those sensitive to blue, green, or red rays may be incorporated. Fog inhibitors, stabilizers and other adjuvants such as, for example, developing agents, hardeners, and matting agents may also be included.

To provide nuclei for physical development, which is one of the structural elements of the image receiving layer, there may be used those substances which are generally known to silver complex diffusion transfer art, such as, for example, colloids of heavy metals including gold, silver, copper, platinum, palladium, zinc, and mercury or of sulfides of these metals.

The invention is illustrated below in detail with reference to Examples which, however, are not intended to limit the invention in any way.

EXAMPLE 1

I. Synthesis of polyfunctional polymer (i) Polyfunctional polymer having imidazole, amido, and carboxyl groups Solution 1 of the composition shown below was added dropwise with stirring to solution 2 of the composition shown below, which was maintained at 70° C., over a period of 30 minutes. The resulting mixture was stirred for further 60 minutes to complete the polymerization. The polymerization mixture was hydrolyzed by adding 6-N sodium hydroxide solution (solution 3 shown below) and heating at 70° C. for 90 minutes. The hydrolyzate mixture was neutralized with nitric acid, cooled, and poured into 38 kg of methanol. The precipitated polymer was collected by filtration and dried.

| Solution 1: | |
|---|---|
| 95% Acrylamide | 10-A moles |
| N-vinylimidazole | A moles |
| Water | 480 g |
| Nitric acid to adjust pH to 5.4 ± 0.1 | |
| Isopropyl alcohol | B g |
| (A is any number smaller than 10) | |
| Solution 2: | |
| Ammonium persulfate | 4.6 g |
| Water | 3,380 g |
| Solution 3: | |
| 6-N nitric acid | C g |

The imidazole group content of the polymer was controlled by adjusting the amount of N-vinylimidazole in the above formulation. The average polymerization degree was controlled by adjusting the amount of isopropyl alcohol. For instance, a polymer having an average polymerization degree of about 500 was obtained by using 1 mole of isopropyl alcohol for 1 mole of the monomer and a polymer having an average polymerization degree of about 1,000 by using 0.3 mole of isopropyl alcohol. The carboxyl group was introduced by hydrolyzing the amido group with sodium hydroxide (solution 3). Thus, polymers shown in the following table were obtained.

| Polymer No. | Imidazole group content (mole-%) | Amido group content (mole %) | Carboxyl group content (mole %) | Average polymerization degree |
|---|---|---|---|---|
| 1 | 1 | 99 | 0 | 1,000 |
| 2 | 1 | 85 | 14 | 1,000 |
| 3 | 2 | 98 | 0 | 1,000 |
| 4 | 2 | 85 | 13 | 1,000 |
| 5 | 5 | 95 | 0 | 1,000 |
| 6 | 10 | 90 | 0 | 1,000 |
| 7 | 10 | 75 | 15 | 1,000 |
| 8 | 20 | 80 | 0 | 1,000 |
| 9 | 40 | 60 | 0 | 1,000 |
| 10 | 5 | 95 | 0 | 300 |
| 11 | 5 | 80 | 15 | 300 |
| 12 | 5 | 95 | 0 | 3,000 |
| 13 | 5 | 80 | 15 | 3,000 |

(ii) Polyfunctional polymer having pyridine ring

Polyfunctional polymers having a pyridine ring were obtained as in (i), except that 4-vinylpyridine was used in place of N-vinylimidazole.

| Polymer No. | Pyridine ring content (mole %) | Amido group content (mole %) | Carboxyl group content (mole %) | Average polymerization degree |
|---|---|---|---|---|
| 14 | 1 | 99 | 0 | 1,000 |
| 15 | 5 | 95 | 0 | 1,000 |
| 16 | 10 | 90 | 0 | 1,000 |
| 17 | 5 | 80 | 15 | 1,000 |

(iii) Polyfunctional polymer having guanidino group

Polyfunctional polymers having a guanidino group were obtained as in (i), except that guanidine acrylate was used.

| Polymer No. | Guanidino group content (mole %) | Amido group content (mole %) | Average polymerization degree |
|---|---|---|---|
| 18 | 15 | 85 | 300 |
| 19 | 5 | 90 | 1,000 |

(iv) Polymers having mercapto, sulfo and hydroxyl groups

Polymers having mercapto, sulfo and hydroxyl groups were obtained by dissolving a commercial polyvinyl alcohol having an average polymerization degree of 300 and a saponification degree of 99.5% in a solution containing sulfuric acid and thioglycolic acid and heating at 70° C. for 2 hours.

| Polymer No. | Mercapto group content (mole %) | Sulfo group content (mole %) | Hydroxyl group content (mole %) |
|---|---|---|---|
| 20 | 9 | 17 | 73.5 |

-continued

| Polymer No. | Mercapto group content (mole %) | Sulfo group content (mole %) | Hydroxyl group content (mole %) |
|---|---|---|---|
| 21 | 2 | 23 | 74.5 |

II. Preparation of lithographic printing plate

A gelatine solution containing carbon black was coated on a sheet of polyethylene coated paper, 135 g/m², which had been subjected to corona discharge treatment. Then, an orthochromatically sensitized high-contrast silver halide emulsion (containing 20 mole-% AgBr, 1 mole-% AgI and 79 mole-% AgCl) was coated over the gelatine coating. The emulsion layer was composed essentially of 1.5 g/m² of silver halide in terms of silver nitrate and 1.5 g/m² of gelatine and contained formaline and dimethylolurea as hardening agent.

The above photosensitive silver halide emulsion-containing photograhic element was left for 3 days at 40° C. and then coated with a palladium sulfide sol prepared according to the following formulations to obtain a lithographic printing element.

| Solution A: | |
|---|---|
| Palladium chloride | 5 g |
| Hydrochloric acid | 40 ml |
| Water | 1,000 ml |
| Solution B: | |
| Sodium sulfide | 8.6 g |
| Water | 1,000 ml |

The solutions A and B were mixed with stirring. After 30 minutes, the resulting mixture was passed through a column packed with ion-exchange resins (IR-120B and IRA-400 of Rohm & Haas Co.) for use in manufacturing purified water. The effluent was admixed with a polymer and a surface active agent to obtain a coating solution.

| Polymer | 10 g |
|---|---|
| Water | 18,000 ml |
| 10% Saponin | 20 ml |

The polymers employed were aforementioned synthetic resins and, as reference, gelatin, polyvinyl alcohol (polymerization degree, 800), polyvinylpyrrolidone (K-30) and carboxymethylcellulose. A coating solution containing no polymer was also prepared for the purpose of a blank test.

III. Processing

The photosensitive element obtained above was exposed, then immersed into a transfer developer of the following formula (C) at 30° C. for 30 seconds, then immediately immersed in a stop bath of the following formula (D) at 25° C. for 30 seconds, then squeezed to remove excess solution, and air-dried under atmospheric conditions.

| Formula C: Transfer developer. | |
|---|---|
| Water | 1,500 ml |
| Sodium hydroxide | 20 g |
| Sodium sulfite | 100 g |
| Hydroquinone | 12 g |
| 1-Phenyl-3-pyrazolidone | 1 g |
| Sodium thiosulfate | 10 g |
| Potassium thiocyanate | 5 g |
| Potassium bromide | 3 g |
| Water to make up to | 2,000 ml |
| Formula D: Stop bath | |
| Water | 2,000 ml |
| Citric acid | 10 g |
| Sodium citrate | 35 g |

IV Printing

The printing plate thus prepared was mounted on an offset press (A. B. Dick 350 CD, trade name). The plate surface was wiped with a solution of the formula E and the plate was used in printing. The printing room was at a temperature of 22° C. and a relative humidity of 60%.

| Formula E: | |
|---|---|
| Water | 400 ml |
| Citric acid | 1 g |
| Sodium citrate | 3.5 g |
| 2-Mercapto-5-heptyl-1,3,5-oxadiazole | 0.5 g |
| Ethylene glycol | 50 ml |

Tap water was used for damping. The printing inks used were "F Gloss Sumi B" and "F Gloss Konai" supplied by Dainippon Ink and Chemicals Co. The last-named ink "F Gloss Konai" was one of those which were liable to cause toning when used with conventional offset printing plate. The ink receptivity and the tendency to cause toning were evaluated in the following way:

(1) Ink receptivity: sheets of printing paper were fed as soon as the inking roller comes into contact with the printing plate surface, using an ink "F Gloss Sumi B". Ink receptivity was evaluated by counting the number of sheets printed before a good quality print has been obtained.

(2) Evaluation of toning tendency: Toning tendency was evaluated by inspecting 1,000 sheets printed with "F Gloss Konai". The rating was as follows: O: No toning detected; Δ: partial of slight toning; X: heavy toning all over the printed sheet.

In addition to the evaluation of printing characteristics, compatibility of each polymer with the palladium sulfide sol was evaluated in preparing the coating solution. The rating was as follows: O: good; Δ: coagulation accelerated but the mixture was remained stable for at least 10 hours; X: immediate coagulation, forming precipitates.

V. Results

The results obtained were as shown in the following table.

Table

| Plate No. | Polymer No. | Compatibility with Pd sulfide sol | Ink receptivity (number of sheets) | Toning | Remarks |
|---|---|---|---|---|---|
| 1 | 1 | O | 15 | Δ | |

Table-continued

| Plate No. | Polymer No. | Compatibility with Pd sulfide sol | Ink receptivity (number of sheets) | Toning | Remarks |
|---|---|---|---|---|---|
| 2 | 2 | O | 15 | Δ | |
| 3 | 3 | O | 15 | O | |
| 4 | 4 | O | 15 | O | |
| 5 | 5 | O | 15 | O | |
| 6 | 6 | O | 15 | O | |
| 7 | 7 | Δ | 20 | O | |
| 8 | 8 | X | — | — | |
| 9 | 9 | X | — | — | |
| 10 | 10 | O | 15 | O | |
| 11 | 11 | O | 15 | O | |
| 12 | 12 | O | 30 | O | |
| 13 | 13 | Δ | 40 | O | |
| 14 | 15 | O | 20 | Δ | |
| 15 | 16 | O | 30 | O | |
| 16 | 19 | O | 20 | O | |
| 17 | 20 | Δ | 40 | O | |
| 18 | 21 | O | 20 | O | |
| 19 | Gelatin | X redispersible on heating | <100 | O | Poor ink deposition |
| 20 | Polyvinyl alcohol | O | 70 | O | Poor ink density in image area |
| 21 | Polyvinyl pyrrolidone | O | 50 | X | " |
| 22 | CMC | O | 70 | X | " |
| 23 | None | — | 15 | X | Blank test |

The above results confirmed the effectiveness of polyfunctional polymers according to this invention.

EXAMPLE 2

The procedure of Example 1 was repeated, except that in preparing the printing element, the coating solution of the following composition containing the physical development nuclei was applied over the emulsion layer.

| | |
|---|---|
| Palladium sulfide sol treated with an ion-exchange resin (Example 1) | 100 ml |
| Hydroquinone | A g |
| Polyfunctional polymer (polymer No. 5 in Example 1) | B g |
| 10% Saponin | 2 ml |
| Water to make up to | 2,000 ml |

In the above composition, the amounts of hydroquinone and polymer were varied. Ten printing plates were prepared as shown in the following table.

In the present Example, in addition to the evaluation of printing characterisitics performed as in Example 1, image reproduction characteristics and thermal stability of the printing plate were also evaluated as described below.

| Plate No. | Hydroquinone (g) | Polymer No. 5 (g) | Ink receptivity (Number of sheets) | Toning | Image reproducibility | Character at plate after 50° C. 80% Rh. 2 days Reproducibility | Toning |
|---|---|---|---|---|---|---|---|
| 24 | — | — | 15 | X | 0.21 | 0.29 | X |
| 25 | — | 0.2 | 15 | Δ | 0.18 | 0.20 | X |
| 26 | — | 0.5 | 15 | | 0.17 | 0.20 | Δ |
| 27 | — | 2.0 | 20 | | 0.17 | 0.20 | Δ |
| 28 | — | 10 | 30 | | 0.17 | 0.20 | Δ |
| 29 | 100 | — | 15 | Δ | 0.16 | 0.18 | Δ |
| 30 | 100 | 0.2 | 15 | | 0.14 | 0.15 | |
| 31 | 100 | 0.5 | 15 | | 0.13 | 0.15 | |
| 32 | 100 | 2.0 | 15 | | 0.13 | 0.15 | |
| 33 | 100 | 10.0 | 20 | | 0.13 | 0.15 | |

The image reproduction characteristics and the thermal stability were tested in the following way.

Image reproduction characteristics: A soft-tone wedge was photoprinted and after plate making the resulting printing plate was used in printing to obtain an inked image, the ink used having been "F Gloss Sumi". The density difference between the foot and the shoulder of the reproduced image of the original was used to evaluate the image reproduction characteristics. A smaller value means higher contrast.

Thermal stability: As a measure to estimate the change with the lapse of time in the stability of the printing plate, plate making and a printing test was performed using the element which had been kept at 50° C. and a relative humidity of 85% for 3 days.

The results obtained above confirmed the advantage of using a developing agent and a polyfunctional polymer each alone or cojointly according to this invention.

EXAMPLE 3

A polyethylene terephthalate film base, 100μ in thickness, which has been pretreated to render it hydrophilic by hydrophilic sub-coating, was coated with a coating solution of the following composition to form a first layer on the film base.

| Gelatin | 25 g |
| --- | --- |
| Water | 400 g |
| Silia ("Syloid" 308 Trade name Fuji-Devison Co.) | 2.5 g |
| Formalin (20% aqueous solution) | 3 g |
| Saponin (20% aqueous solution) | 20 g |

The application rate was 30 g of solution per square meter. The coated film was left for 3 days at 40° C. and then overcoated with a silver sol, prepared in the following manner, at an application rate of 10 g of sol per square meter.

Preparation of silver sol:

| 6.2% - AgNO$_3$ | 100 ml |
| --- | --- |
| 1% - KBr | 1 ml |
| 2% - Formalin | 10 ml |
| 0.03N - NaOH | 10 ml |

The above composition was ripened at 60° C. for 1 hour, then adjusted to pH 4.0±0.1 with 0.1 N sulfuric acid, admixed with 2 g of hydroquinone and 0.2 g of polymer No. 15 in Example 1, and made up with water to 200 ml.

The thus obtained receiving sheet was closely contacted with a generally known negative sheet for silver complex diffusion transfer and subjected to transfer treatment to form a metallic silver image on said receiving sheet. The thus treated sheet was mounted on an offset press and set in printing operation using a damping solution of the following composition:

| Monoammonium phosphate | 10 g |
| --- | --- |
| Clycerine | 30 g |
| Made up with water to | 1,000 ml |

The printing plate showed desirable ink receptivity and produced a great numer of copies with sharp image and without any toning.

EXAMPLE 4

A polyester film base, 100μ thick, which had been subjected to a hydrophilic subbing treatment, was applied with a gelatin undercoating composition containing silica particles, 5μ in average particle size, and carbon black and further admixed with formalin and dimethylolurea as colloid hardener. The applied rates of gelatin and silica were 1.2 and 0.7 g/m$^2$, respectively, and the coating showed a transmission density of 1.6 at 500 mμ. Over the undercoat was then coated an orthochromatically sensitized high-sensitivity emulsion of the direct positive type. After drying, the thus coated film was left for 2 days at 40° C. The emulsion layer had the following compositional characteristics:

Composition of silver halide: bromoidide containing 1 mole-% of silver iodide.
Crystalline form and average size of silver halide grains: cubic, 0.25μ.
Coverage of silver halide in terms of silver nitrate: 2.2 g/m$^2$.
Coverage of gelatin: 1.6 g/m$^2$
Colloid hardener: formalin and dimethylolurea.

Subsequently, a coating preparation containing nuclei for physical development and of the following composition was applied onto the emulsion layer at a rate of 10 g/m$^2$ on wet basis. The coating was then dried.

| Palladium sulfide sol, treated with an ion exchange resin (Example 1) | 100 ml |
| --- | --- |
| Polyfunctional synthetic resin (polymer No. 15 in Example 1) | A g |
| Hydrophilic polymer | B g |
| 10% Saponin solution | 2 ml |
| Water to make up to | 1,000 ml |

In the above formulation, the amount (A) of the polyfunctional synthetic polymer and the type and amount (B) of the hydrophilic polymer were as shown in the table given below.

By means of a micro-printer, an enlarged image was formed on the negative-type photosensitive material obtained above by exposing to light through a negative microfilm. The exposed photosensitive material was processed and used as an offset printing plate in the same manner as in Example 1.

The results were as shown in the following table. The methods of evaluation were the same as in Example 1. As seen from the table, good printing characteristics were exhibited by using the polyfunctional synthetic polymer alone or in combinations with other hydrophilic polymers according to this invention.

| Plate No. | Polymer No. 15 (A) (g) | Hydrophilic polymer Type | (B) (g) | Ink receptivity (number of sheets) | Toning | Remark |
| --- | --- | --- | --- | --- | --- | --- |
| 34 | — | — | — | 10 | X | Comparative Example |
| 35 | 0.2 | — | — | 10 | Δ | Example 6 |
| 36 | 0.5 | — | — | 10 | Δ | " |
| 37 | 1.0 | — | — | 15 | | " |
| 38 | 2.0 | — | — | 15 | | " |
| 39 | — | Carboxymethyl-cellulose | 0.2 | 10 | X | Comparative Example |
| 40 | — | " | 0.5 | 30 | X | " |
| 41 | 0.2 | " | 0.2 | 10 | | Example 6 |
| 42 | — | Copolymer of polyvinyl methyl ether and maleic anhydride | 0.2 | 10 | X | Comparative Example |
| 43 | — | " | 0.5 | 10 | X | " |
| 44 | — | " | 1.0 | 40 | X | " |

| Plate No. | Polymer No. 15 (A) (g) | Hydrophilic polymer Type | (B) (g) | Ink receptivity (number of sheets) | Toning | Remark |
|---|---|---|---|---|---|---|
| 45 | 0.2 | " | 0.5 | 10 | | Example 6 |

What is claimed is:

1. A lithographic printing plate element using silver complex diffusion transfer process, characterized in that at least one of a layer which contains nuclei for physical development comprising a heavy metal or a sulfide thereof and a layer adjacent to said layer contain a polyfunctional synthetic polymer containing 1 to 20 mole % of functional groups having an affinity to said nuclei and being characterized by having affinity for colloidal heavy metal or a sulfide thereof and 5 to 99 mole % of functional groups providing hydrophilic properties.

2. An element according to claim 1, wherein the functional group having an affinity for the nuclei is selected from 5- or 6-membered heterocyclic groups having in the ring at least one of N, O, and S, which heterocyclic groups may be in the form of polynuclear condensed ring formed of two or more of said heterorings or in the form of polynuclear condensed ring formed of said heteroring and a benzene or naphthalene ring.

3. An element according to claim 2 also including a developing agent for silver halide and wherein said developing agent is at least one compound selected from the group consisting of developing agents of the hydroxybenzene type and derivatives thereof and 1-phenyl-3-pyrazolone and derivatives thereof.

4. An element according to claim 3, wherein the developing agent includes p-aminophenol or a derivative thereof.

5. An element according to claim 2 also including the developing agent for silver halide.

6. An element according to claim 1, wherein the functional group having an affinity for the nuclei is selected from the group consisting of thioether group, thiol group, and thioxo group.

7. An element according to claim 1, wherein the functional group having an affinity for the nuclei is amino group or guanidino group.

8. An element according to claim 1, wherein the functional group providing hydrophilic property is at least one member selected from the group consisting of hydroxyl group, carboxyl group, sulfo group, and amido group.

9. An element according to claim 1, including the polyfunctional synthetic polymer, said polymer consisting essentially of 1 to 20 mole-% of the structural unit represented by the following formula (1) and 5 to 99 mole-% of the structural unit represented by the following formula (2):

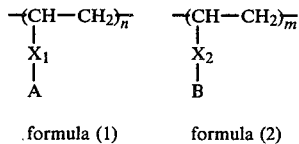

formula (1)    formula (2)

wherein A is a functional group having an affinity for the nuclei, B is a functional group providing hydrophilic property, $X_1$ and $X_2$, which may be absent, are groups connecting A and B, respectively, to one of the carbon atoms of the vinyl unit.

10. An element according to claim 9, wherein A is one member selected from the group consisting of 5- or 6-membered heterocyclic groups having in the ring at least one of N, O and S, which heterocyclic groups may be in the form of polynuclear condensed ring formed of two or more of said heterorings or in the form of polynuclear condensed ring formed of said heteroring and a benzene or naphthalene ring, thio ether groups, thiol group, thioxo group, amino group, and guanidino group; and B is one member selected from the group consisting of carboxyl group, sulfo group and amido group.

11. The element of claim 10 wherein the polyfunctional synthetic polymer has a polymerization degree of about 100 to about 3000.

12. An element according to claim 9, wherein the polyfunctional synthetic polymer has a polymerization degree of about 100 to about 3,000 based on recurring vinyl unit, and the content of the functional group having an affinity for the nuclei for physical development is 2 to 10 mole-%.

13. An element according to claim 9, wherein the polyfunctional synthetic polymer has a polymerization degree of about 300 to about 1,000.

14. An element according to claim 9 wherein the functional group A having an affinity for the nuclei is an imidazole group or such a group having substituents and the functional group B providing hydrophilic properties is an amido group.

15. An element according to claim 9 also including a developing agent for silver halides and wherein the polyfunctional synthetic polymer is used with said developing agent for silver halides.

16. An element according to claim 15, wherein the developing agent for silver halide is at least one compound selected from the group consisting of developing agents of the hydroxybenzene type and derivatives thereof, 1-phenyl-3-pyrazolone and derivatives thereof, and p-aminophenol and derivatives thereof.

17. The element of claim 9 wherein the polyfunctional synthetic polymer has a polymerization degree of about 100 to about 3000.

18. An element according to claim 9 wherein the developing agent is present in a layer over a silver halide emulsion layer.

19. An element according to claim 1, including said polyfunctional polymer the amount used of the polyfunctional synthetic polymer being in the range of 0.0001 to 0.1 g/m².

20. An element according to claim 1 including a polymer blend of at least one of the polyfunctional synthetic polymers and at least one of the hydrophilic polymers not having a functional group having an affinity for nuclei for physical development.

21. The element of claim 20 wherein the hydrophilic polymer is a member of the group consisting of polyvinylpyrrolidone, polyvinylacrylamide, carboxymethylcellulose, polyethylene glycol, polyvinyl methyl ether and a copolymer of polyvinyl methyl ether and moleic anhydride.

22. The element according to claim 1 wherein the polyfunctional synthetic polymer is a member of the group consisting of a vinyl polymer, a polymer having a main chain of polyethylene glycol and having attacked mercapto groups and a polymer having a main chain of cellulose having a attached sulfo or mercapto groups.

* * * * *